United States Patent [19]

Benn, Sr. et al.

[11] Patent Number: 5,068,493
[45] Date of Patent: Nov. 26, 1991

[54] DUAL ELASTOMER GASKET SHIELD FOR ELECTRONIC EQUIPMENT

[75] Inventors: Robert C. Benn, Sr.; Robert C. Benn, Jr., both of Danbury, Conn.

[73] Assignee: Vanguard Products Corporation, Danbury, Conn.

[21] Appl. No.: 599,195

[22] Filed: Oct. 17, 1990

Related U.S. Application Data

[63] Continuation-in-part of Ser. No. 269,350, Nov. 10, 1988, Pat. No. 4,968,854.

[51] Int. Cl.$^5$ .............................................. H05K 9/00
[52] U.S. Cl. ........................ 174/35 GC; 219/10.55 D
[58] Field of Search ................... 174/35 GC, 35 R; 219/10.55 D

[56] References Cited

U.S. PATENT DOCUMENTS

| | | | |
|---|---|---|---|
| 3,446,906 | 5/1969 | Zulauf | 174/35 GC |
| 3,576,387 | 4/1971 | Derby | 174/36 |
| 3,609,104 | 9/1971 | Ehrreich | 174/35 GC X |
| 3,783,173 | 1/1974 | Twomey | 174/35 GC |
| 4,011,360 | 3/1977 | Walsh | 174/35 GC X |
| 4,288,081 | 9/1981 | Sado | 174/35 GC X |
| 4,399,317 | 8/1983 | Van Dyk, Jr. | 174/35 GC |
| 4,659,869 | 4/1987 | Busby | 174/35 GC |
| 4,777,205 | 10/1988 | La Scola et al. | 252/511 X |
| 4,836,955 | 6/1989 | Ehrreich | 174/35 GC |
| 4,864,076 | 9/1989 | Stickney | 174/35 GC |
| 4,960,633 | 10/1990 | Hiza et al. | 219/10.55 D |
| 4,968,854 | 11/1990 | Benn, Sr. et al. | 174/35 GC |
| 4,977,295 | 12/1990 | Chin et al. | 174/35 GC |

FOREIGN PATENT DOCUMENTS

| | | |
|---|---|---|
| 1116650 | 1/1982 | Canada. |
| 2222913A | 3/1990 | United Kingdom ........... 174/35 GC |

OTHER PUBLICATIONS

Crosby, E. G. and Nuccio, C., "Conductive Seal for Electromagnetic Shielding in Electrical Enclosure", IBM Technical Disclosure Bulletin, vol. 20, No. 1, Jun. 1977, pp. 282-283.

*Primary Examiner*—Morris H. Nimmo
*Attorney, Agent, or Firm*—Browdy and Neimark

[57] ABSTRACT

An improved gasket shielding for electronic equipment is provided in the form of an integral two-layer component including a support layer and a cover layer, the support layer being strong and having excellent physical properties, and the cover layer being filled with metal flakes and having excellent electrical energy attenuation properties.

19 Claims, 1 Drawing Sheet ly acceptable form for purposes of the present invention.

DUAL ELASTOMER GASKET SHIELD FOR ELECTRONIC EQUIPMENT

FIELD OF THE INVENTION

This is a continuation in part of parent, co-pending application Ser. No. 07/269,350, filed Nov. 10, 1988, now U.S. Pat. No. 4,968,854 the contents of which are hereby incorporated by reference.

The present invention relates to the shielding of electronic equipment and, more particularly, to gaskets for cabinet enclosures and the like, such gaskets serving to shield the electronic equipment from damage due to exterior electromagnetic radiation.

Producers of commercial electronic equipment, not to mention defense applications, are being forced to improve the performance of shielding devices to counteract electromagnetic interference complicated by the ever higher frequencies of energy generation in and beyond the megahertz range. Openings in cabinet enclosures for access doors, hinges, etc. must be so protected by the use of suitable shielding.

This has been an ongoing problem and various solutions have been proposed, these prior solutions however being unsatisfactory from one or more points of view. Thus, the prior devices have been insufficient from point of view of at least one or more of the following requirements:

(1) Attenuation of internal and external interferences using gasketing with resistive values with the range of 0.1 to 0.001 ohm-cm and selectable attenuation from 30 to 90 dB.

(2) Low compression set of the gasket so long term mechanical sealing is maintained.

(3) Superior physical properties of the gasket to prevent failure due to tearing forces.

(4) Resistance to reduced electromagnetic shielding due to oxidation.

(5) Ease of cleanliness maintenance.

(6) Freedom from free metal chips as occurs with the initial fitting and subsequent deterioration of metallic meshes and metal assemblies.

(7) A neat appearance of the shield.

(8) Ease of installation and replacement.

(9) Low cost relative to alternate designs.

There are presently available four different types of cabinet shielding means which suffer one or more defects. These are as follows:

| Product | Principal Inadequacy |
|---|---|
| (1) Carbon Filled Elastomers | Shielding ability falls off in the higher frequency range |
| (2) Metal Filled Elastomers | Poor physical properties (compression set, tear, etc.) |
| (3) Metal Mesh with Elastomeric Core | Hard to cut cleanly for corners; chips of free metal |
| (4) Metallic Seals (Spring-like fingers) | Difficult to keep clean, oxidation |

In the process exemplified in parent application Ser. No. 07/269,350 now U.S. Pat. No. 4,968,854 namely co-extrusion, and also in the case of the use of a coating die-head for formation of the outer layer, the draw-down of the outer layer on the surface of the inner layer can reduce point-to-point contact among and between adjacent metallic particles, resulting in a corresponding decrease in conductivity. When it is further understood that the formation of the outer layer is critical for realizing the highest conductivity and best attenuation in the finished product, it will be understood that maximum continuity or packing of metallic particles is desirable. If one considers the case of closely packed spherical metallic particles, the interruption in continuity which can result from the aforementioned draw-down can easily occur by length separations only in the micron range. Moreover, when it is understood that the closely packed spheres are dispersed in an elastomeric matrix, e.g. a silicone gum, continuity is somewhat decreased because the elastomer, being a solid, is not a compressible fluid such as air, i.e. the elastomer matrix occupies space and cannot be compressed to bring all metallic particles tightly together. Furthermore, when the outer layer composition exits the forming die, some expansion may occur.

SUMMARY OF THE INVENTION

It is therefore an object of the present invention to overcome previously existent deficiencies, such as those indicated above.

It is another object of the present invention to provide an improved gasket shielding material for electronic equipment.

It is yet another object of the present invention to provide dual elastomer gasket shielding for counteracting electromagnetic interference.

It is a further object of the present invention to provide an improved dual layer gasket for electromagnetic shielding wherein improved metal contact is achieved in the outer layer.

These and other objects are achieved according to the present invention by the provision of an elastomeric gasket formed in two layers, preferably by dual extrusion or by extrusion coupled with coating from a coating die head, in the form of a support or inner gasket layer having high strength and a relatively thin coating or outer gasket layer having excellent ability to counteract or attenuate electromagnetic radiation, the relatively thin coating layer being filled with flake-like or platelet-like metallic particles.

The above and other objects and the nature and advantages of the present invention will be more apparent from the following detailed description of certain specific embodiments thereof.

DETAILED DESCRIPTION OF EMBODIMENTS

The present invention corresponds in general with the embodiments disclosed in parent application Ser. No. 07/269,350, now U.S. Pat. No. 4,968,854 incorporated by reference.

Figure 1:
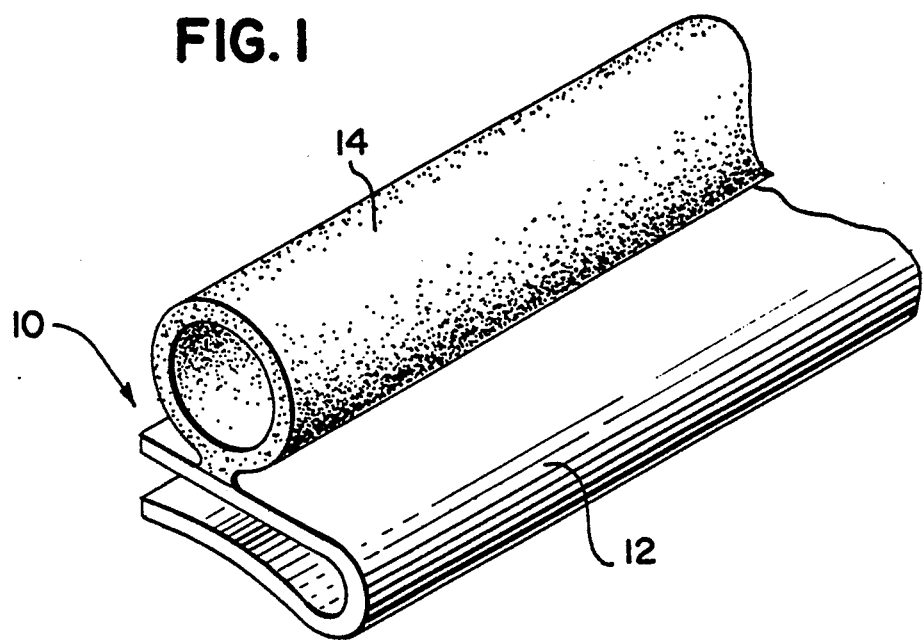
FIG. 1 is a perspective view of an EMI gasket configuration to which the subject of the present invention may be applied.
Figure 2A:
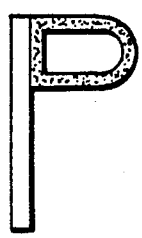
FIGS. 2a–2f are end views of other possible configurations, FIG. 2d being somewhat similar to the embodiment of FIG. 1.
Figure 2B:
Figure 2C:
Figure 2D:
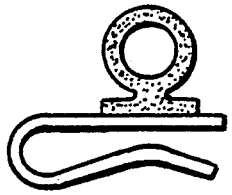
Figure 2E:
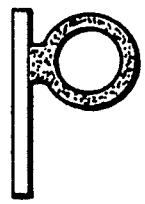
Figure 2F:
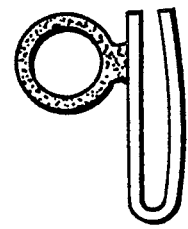
Figure 3:
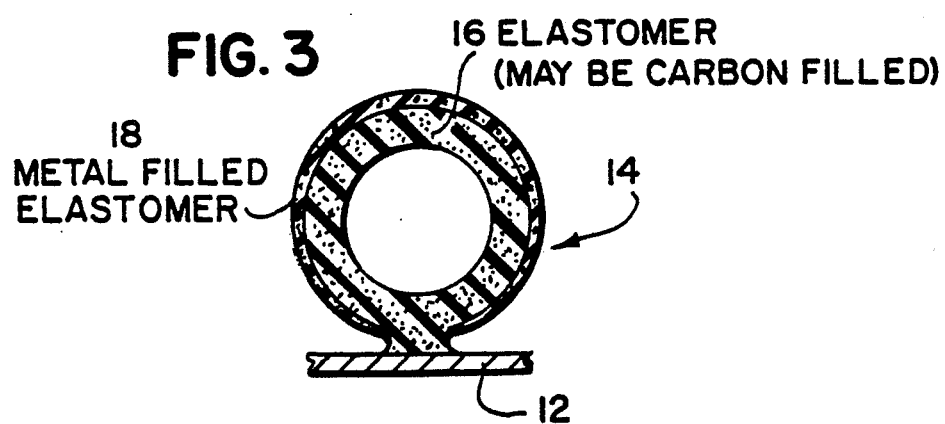
FIG. 3 is an enlarged partial cross-sectional view of the gasket of FIG. 1.

FIG. 1 shows an EMI gasket 10 of typical configuration, but in accordance with the present invention, having a metal clip part 12 and a rubber gasket part 14 adhered together. FIGS. 2a–2f show various other typical forms which may be used.

In accordance with the present invention, the gasket part 14 is formed of a non-metallic, yet conductive, elastomeric inner portion 16 to which is permanently bonded, preferably by co-extrusion within the die, and outer sheathing or covering 18 of metal-filled elastomer. From the embodiment of FIGS. 1, 3, 2a, 2b, and 2d-2f, it will be understood that such a gasket may be co-extruded and bonded during extrusion onto metallic and conductive non-metallic shapes for convenient assembly to cabinets. From FIG. 2c, it will be understood that the gasket material can be provided in other shapes which can be subsequently attached to a suitable substrate. In general, the extrusions are made in continuous length, shaped to any desired uniform cross-section.

The product can be formed onto a metallic carrier, for example a flat metal strip (see FIGS. 2a, 2e and 2b) or a roll-formed shape (FIGS. 2d and 2f) by passing the metal substrate through the co-extrusion tooling in a continuous process. The inner portion 16 is chemically locked to the metallic layer thus ensuring transmission of electrical energy unimpeded between the co-elastomer and the metallic carrier.

The inner layer 16 is constructed of a strong elastomeric material which has good physical properties, including high tear resistance, as well as the ability to recover shape after deformation, i.e. good elasticity. This material is desirably carbon filled rubber.

The metal filled exterior covering 18 provides a higher degree of attenuation of electrical energy than presently available non-metal filled elastomeric shielding. On the other hand, such metal filled elastomer used alone as a shielding material suffers from poor physical properties, including low tearing resistance, and its recovery of shape after deformation is poor, The metal filler does not reinforce the elastomer and acts as a diluent. Furthermore, as the cost of the metal, usually silver, is relatively high, it is desirable to minimize the quantity of the material used.

By chemically bonding a metal-filled elastomer 18 to a carbon-filled elastomer substrate 16, the amount of expensive metal filler used is minimized and the tear resistance and compression recovery of the gasket 14 substantially improved. In addition, the shielding effectiveness is substantially improved over the use of carbon-filled rubber alone. The product is easily cleaned to maintain shielding effectiveness and presents a neat appearance.

When the two elastomers 16 and 18 are simultaneously bonded under the pressure of co-extrusion, the unity of the resultant gasket is assured and electrical and physical results are optimum.

It will be understood that both layers 16 and 18 are conductive, except that the outer layer 18 is considerably more conductive while the inner layer 16 is less conductive but much stronger and with better physical properties. They are bonded by co-extrusion in a molecular sharing way, and thus provide a superior electrical shield over either one used alone.

The inner layer 16 is substantially thicker than the outer coating, preferably on the order of 5 to 20 times as thick when such layer 16 is hollow as preferred, preferably at a thickness ratio of 10:1, the outer coating 18 desirably being 2-8 mils thick and the inner support layer 16 being 5-160 mils thick, preferably 20-80 mils thick.

The inner support layer may be formed of a variety of elastomers, but preferably it comprises an elastomeric silicone polymer containing fumed silica and carbon black as reinforcers, plus a suitable crosslinking agent. Alternatively, the inner layer 16 may be composed of a non-conductive silicone elastomer, such as one comprising silicone gum, fumed silica and a cross-linking agent. The covering layer 18 is suitably formed of an elastomeric silicone polymer filled with metal flakes. A main difference according to the present invention compared to the embodiments described in parent application Ser. No. 07/269,350, now U.S. Pat. No. 4,968,854 is the replacement of the generally spherical metallic particles described in the parent application with flake-like or platelet-like particles, which in a closely-packed configuration allows for increased contact among and between adjacent particles. For an equal weight quantity of metallic particles, the relatively flat particles used in the present invention provide enhanced contact and thereby achieve a higher degree of electrical continuity and improved shielding.

It will be understood that during the formation of the outer layer either by co-extrusion with the inner layer or by the use of a coating die-head, the metallic platelets will become oriented as the outer layer composition passes through the die so that the large surfaces of the platelets lie parallel to the surfaces of the layers. As a result, the draw-down of the metallic platelet-filled elastomeric dispersion causes separation among and between the platelets only in the direction paralled to the planes of the particles; and as a result the particles maintain contact rather than being pulled apart, i.e. the surfaces of the platelets can slide apart a substantial degree without loss in particle-to-particle contact, thus maintaining maximum conductivity.

Another advantage of the use of metallic platelets over generally spherical particles is that to achieve an equivalent degree of contact and consequently an equivalent amount of shielding efficiency, less metal filler is required by the use of metallic flakes than by the use of generally spherical powder, and as a result the present invention creates reductions in costs.

Suitable metallic flakes for use in the outer layer composition according to the present invention may be widely selected. Several types of suitable flakes are available including silver flakes, silver coated copper flakes, silver coated mica, silver coated bronze flakes and silver coated aluminum flakes. Flakes of noble metals other than silver or flakes coated with noble metals other than silver such as gold, paladium, platinum, can be used, or flake of copper, bronze or nickel. Various different types of flakes can be used in admixture with one another, flakes according to the present invention can be used admixed with conventional generally spherical metallic particles, such as conventional silver powder, in ratios ranging from 95:5 to 5:95.

The size of the flakes is dictated only by practical considerations including handling, ability to pass through the die head, etc. and in general a diameter or length of less than 150-200 microns is desirable, with a thickness no greater than about 25% of the length or diameter. Platelets of an average length of 5 microns and a thickness no greater than about 2 microns are suitable.

As indicated above, the elastomeric matrix material is desirably rubber and is preferably silicone rubber, although other elastomeric materials can be used such as natural rubber, nitrile rubber or epichlorohydrin rubber. Per one hundred parts by weight of elastomer, e.g. 30 durometer silicone elastomer, the quantity of metallic filler in flake or platelet form, e.g. silver flake, is 250 to 2000 parts by weight, although the weight ratio can vary considerably beyond those parameters, i.e. in general the quantity of metallic flake to elastomer may comprise from 0.5 to 25 parts by weight. The quantity of metallic flake must not be so low as to result in insufficient electromagnetic shielding, nor so high that the outer layer becomes brittle, fragile and/or so inflexible as to not be able to retain its coherency in use.

Gaskets according to the present invention provide excellent electromagnetic shielding.

Properties of such gaskets are as follows:

| | |
|---|---|
| Volume Resistivity, MIL-G-83528A Paragraph 4.6.11 | 0.005 to 0.05 ohm-cm |
| Shielding Effectiveness MIL-STD-285 | 110 dB |
| Tensile Strength, ASTM D 412 | 700 to 2,000 psi |
| Durometer, Shore A, ASTM D 2240 | 30 to 85 |

The following examples are offered illustratively:

EXAMPLE 1

Suitable gasket material is made using inner core material as disclosed in parent application Ser. No. 07/269,350, now U.S. Pat. No. 4,968,854 and co-extruding therewith as an outer coating a composition as set forth in Table 1 below.

TABLE 1

| | |
|---|---|
| 100 pbw | Silicone elastomer, 30 durometer |
| 500 pbw | Silver flake |
| 1.2 pbw | Organic peroxide curing agent |

EXAMPLE 2

A gasket is made as disclosed above in Example 1, but wherein the outer coating composition is as set forth in Table 2 below.

TABLE 2

| | |
|---|---|
| 100 pbw | Silicone elastomer, 30 durometer |
| 150 pbw | Silver flake |
| 250 pbw | Silver plated copper powder |
| 1-4 pbw | Organic peroxide |

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. In a gasket shield for counteracting electromagnetic interference comprising a flexible gasket element, the improvement wherein said gasket element comprises a relatively thick elastomeric inner layer of good elasticity and strength, and a very thin outer layer integral therewith, said outer layer comprising a synthetic polymeric material filled with metallic flakes oriented parallel to said outer layer and providing a high degree of attenuation of electrical energy.

2. A gasket shield according to claim 1, wherein said inner layer is conductive.

3. A gasket shield according to claim 2, wherein said inner and outer layers are formed of rubber, and said inner layer is carbon filled.

4. A gasket shield according to claim 1, wherein said inner layer is on the order of 10 times thicker than said outer layer.

5. A gasket shield according to claim 4 wherein said inner layer has a thickness of no greater than about 8 mils.

6. A gasket shield according to claim 1, wherein said inner and outer layers are chemically bonded to one another.

7. A gasket shield according to claim 1, wherein said inner and outer layers are co-extruded.

8. A gasket shield according to claim 1, further comprising a metallic substrate chemically locked thereto.

9. A gasket shield according to claim 1 wherein said outer layer has a thickness of no greater than about 8 mils.

10. A gasket shield according to claim 1 wherein said outer layer has a thickness of about 2-8 mils.

11. A gasket shield for counteracting electromagnetic interference, comprising a flexible gasket element having a relatively thick elastomeric inner layer of good elasticity and strength, formed of carbon-filled rubber, and a very thin flexible outer layer integral therewith, said outer layer being filled with metallic flakes oriented parallel to said outer layer and providing a high degree of attenuation of electrical energy.

12. A gasket shield according to claim 11, wherein said outer layer has a thickness of no greater than about 8 mils.

13. A gasket shield according to claim 12 wherein said inner layer is on the order of 10 to 20 times thicker than said outer layer.

14. A gasket shield according to claim 11, wherein said inner and outer layers are formed of cross linked rubber.

15. A gasket shield according to claim 11, wherein said inner and outer layers are formed of silicone rubber.

16. A gasket shield according to claim 15, wherein said inner layer comprises a non-conductive, fumed silica reinforced silicone rubber.

17. A gasket shield according to claim 15, wherein said inner layer comprises a conductive, carbon-black and fumed silica reinforced silicone rubber.

18. A gasket shield according to claim 15 wherein said inner layer is on the order of 10 to 20 times thicker than said outer layer.

19. A gasket shield according to claim 11 wherein said outer layer has a thickness of about 2-8 mils.

* * * * *